United States Patent [19]

Miyanishi

[11] Patent Number: 5,018,105
[45] Date of Patent: May 21, 1991

[54] SEMICONDUCTOR MEMORY DEVICE
[75] Inventor: Hideji Miyanishi, Toyonaka, Japan
[73] Assignee: Ricoh Co., Ltd., Tokyo, Japan
[21] Appl. No.: 526,608
[22] Filed: May 22, 1990
[30] Foreign Application Priority Data
May 26, 1989 [JP] Japan .................................. 1-134367
[51] Int. Cl.$^5$ ....................... G11C 13/00; G11C 11/40
[52] U.S. Cl. ...................................... 365/203; 365/205
[58] Field of Search ................... 365/203, 205, 189.05, 365/230.08

[56] References Cited
U.S. PATENT DOCUMENTS
4,953,129 8/1990 Kobayashi et al. ................. 365/203

Primary Examiner—Terrell W. Fears
Attorney, Agent, or Firm—Cooper & Dunham

[57] ABSTRACT

A semiconductor memory device includes a pair of bit lines and a sense amplifier device. Each of the pair of bit lines has a parasitic capacitor and a memory cell connected thereto respectively. The memory cell has an electric capacity and a word line connected to a gate of a transistor. The sense amplifier device has a first sense amplifier, a second sense amplifier, a first transistor, a second transistor and a third transistor for amplifying a potential difference caused by a balance between the parasitic capacitor of one bit line and the electric capacity of one memory cell connected to the one bit line after the pair of bit lines are precharged and the word line of the one memory cell is raised.

8 Claims, 3 Drawing Sheets

SEMICONDUCTOR MEMORY DEVICE

BACKGROUND OF THE INVENTION

1. Field of the Invention

The present invention relates to a semiconductor memory device.

2. Description of the Related Art

In a conventional dynamic read and write memory (hereinafter referred to as a DRAM), bit lines are connected to each source of a plurality of N-channel MOS transistors (hereinafter referred to as a NMOS) including a plurality of memory cells. The gates of the NMOS transistors are connected to word lines for selecting a memory cell to be accessed. The drains of the NMOS tranisitors are grounded through capacitors. The two bit lines are connected to each other through the sense amplifier.

When a stored data is read out in such a DRAM, supplying of a high (H) level signal to the selected word line turns the NMOS transistor ON, thereby the capacitor and the bit line become conductive. Because the bit line has a parasitic capacitor, the electric potential of the bit line becomes a balanced electric potential of the charge stored in the capacitor and the charge in the parasitic capacitor. Therefore, a potential difference develops between the bit line and another bit line connected to another memory cell where the word line is not selected. The developed potential difference is amplified by the sense amplifier. This potential difference between the bit line and the other bit line 0.2 volts at most.

A trend in recent years is that the capacitors in the memory cells are getting smaller, while on the contrary the capacitance of the parasitic capacitors of the bit lines is getting larger due to high density DRAMS. For this reason, the above described potential difference tends to decrease. The sense amplifier can be operated by a variation of a potential difference caused by noise. Thus, such a small potential difference hinders stable operation of the sense amplifier and is responsible for a problem in which the operation speed of the sense amplifier is limited because it takes time to ampifly the small potential difference.

SUMMARY OF THE INVENTION

It is an object of the present invention to provide a semiconductor memory device which permits faster operation. The object can be achieved by a semiconductor memory device comprising a pair of bit lines each having a parasitic capacitance and a memory cell connected thereto, the memory cell having an electric capacitance and a word line connected to a gate of a transistor; and a sense amplifier device having a first sense amplifier composed of NMOS transistors, a second sense amplifier composed of PMOS transistors, a first transistor composed of NMOS, a second transistor composed of PMOS and a third transistor composed of NMOS for amplifying a potential difference between the pair of bit lines, the potential difference being caused by a balance between the parasitic capacitance of one bit line and the electric capacitance of one memory cell connected to the one bit line after the pair of bit lines are precharged and the word line of the one memory cell is raised; the first sense amplifier connected to each of the pair of bit lines at an input and an output thereof and a first electric power source with a first capacitor; the second sense amplifier connected to each of the pair of bit lines at an input and an output thereof and a second electric power source with a second capacitor; the first transistor connected to the first electric power source at one end thereof and grounded at another end thereof for controlling a supply of electric power to the first sense amplifier from the first electric power source by a first control signal; the second transistor connected to the second electric power source at one end thereof and to a positive electric source at another end thereof for controlling a supply of electric power to the second sense amplifier from the second electric power source by a second control signal; the third transistor for short-circuiting between the pair of bit lines by a third control signal.

Since the present invention includes a pair of bit lines and a sense amplifier having a first sense amplifier connected to the pair of bit lines and the first electric power, a second sense amplifier connected to the pair of bit lines and the second electric power, a first transistor, a second transistor and a third transistor for amplifying a potential difference between the pair of bit lines, during the period between a predetermined time, a potential difference about 10 times that of the conventional semiconductor device can thus be obtained. The time required for an electric potential to come to a final electric potential can also become short.

Other features and advantages of the present invention will become apparent upon the following Description of the Preferred Embodiment when read in connection with the attached drawings.

DESCRIPTION OF THE PREFFERED EMBODIMENTS

Figure 1:
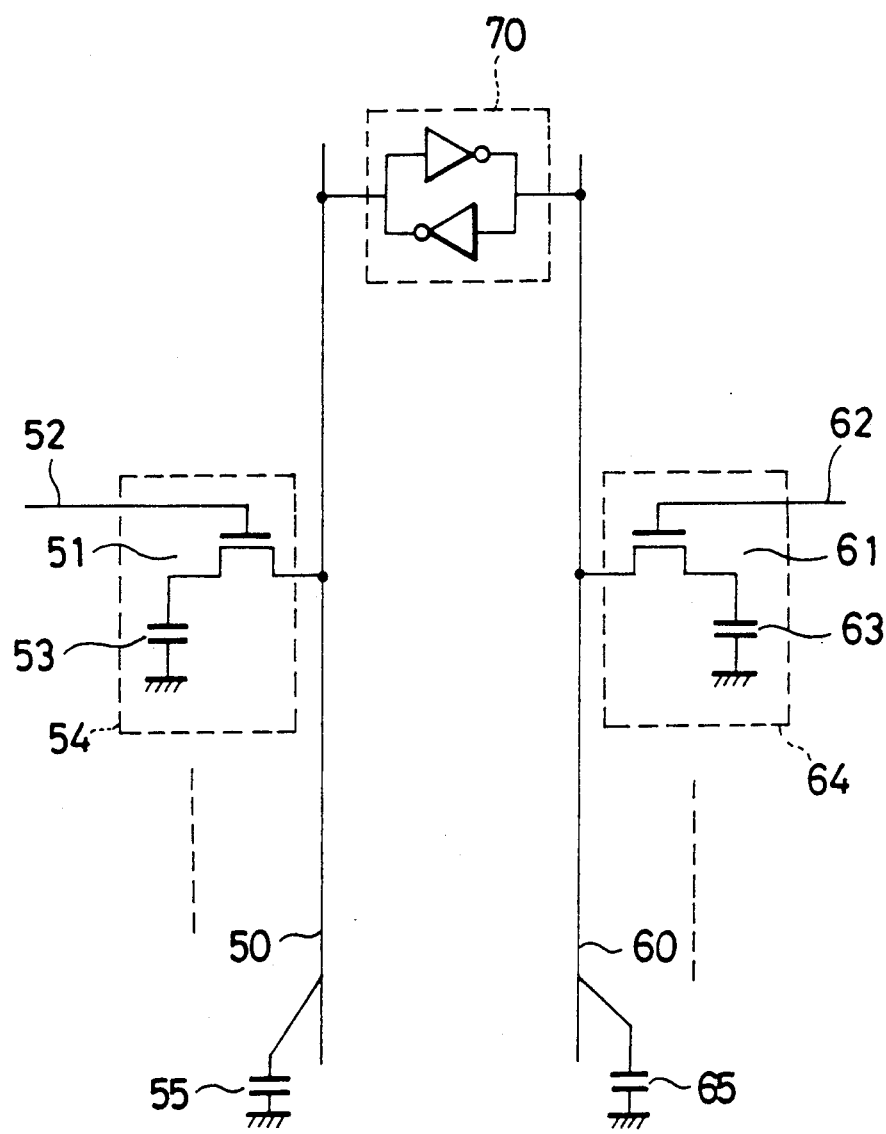
FIG. 1 is a circuit diagram showing a construction of a semiconductor memory device with a conventional sense amplifier device.

FIG. 1 is a circuit diagram showing the construction of the semiconductor memory device with a conventional sense amplifier device. A pair of bit lines with reference numerals 50, 60, NMOS transistors with reference numeral 51, 61, word lines with reference numerals 52, 62, capacitors with reference numerals 53, 63, parasitic capacitors with reference numerals 55, 65, memory cells with reference numerals 54, 65 and a sense amplifier with a reference numeral 70 are respectively shown in FIG. 1.

Figure 2:
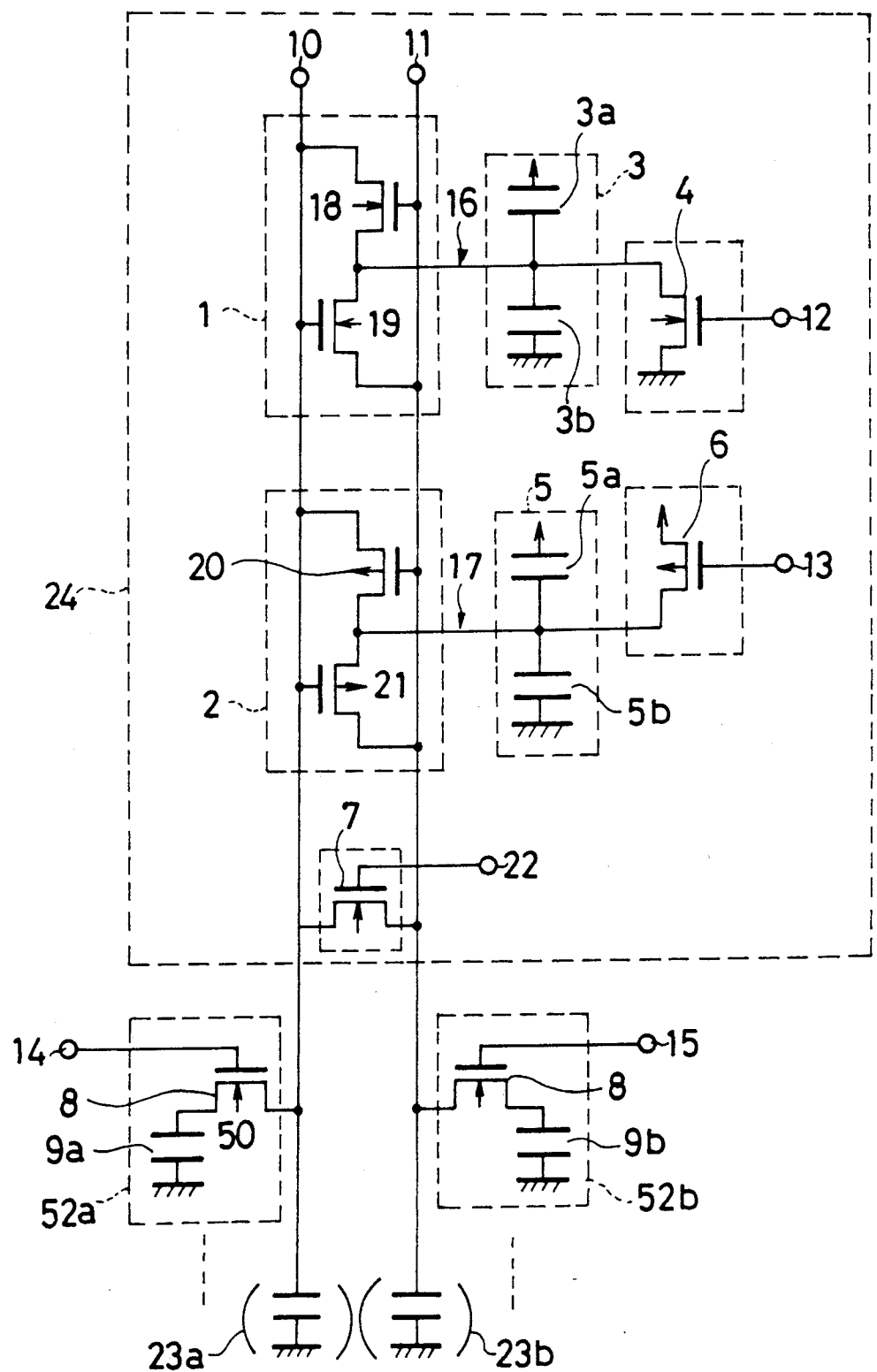
FIG. 2 is a circuit diagram showing a construction of a semiconductor memory device with a sense amplifier device according to the present invention.
Figure 3:
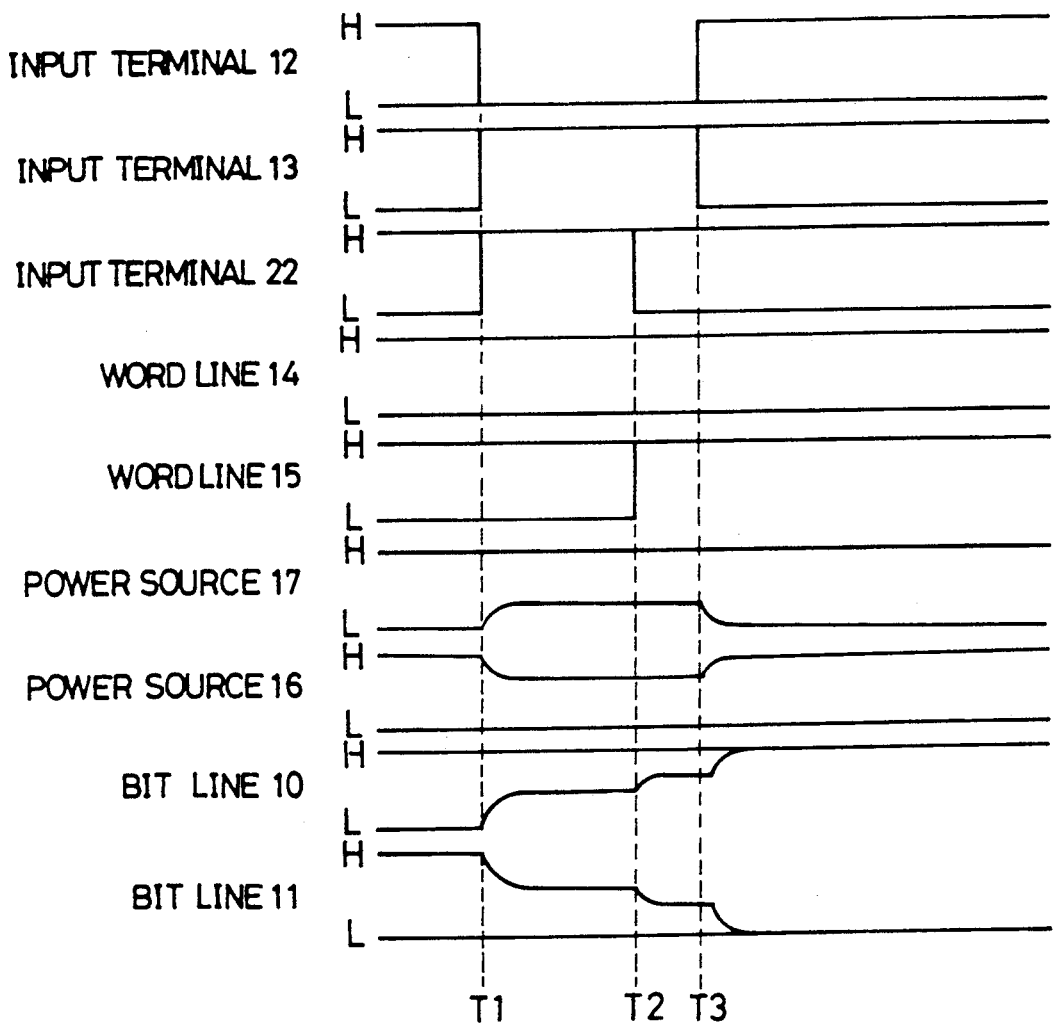
FIG. 3 is a time chart showing an operation of the sense amplifier of FIG. 2.

An embodiment according to the present invention will now be described with the reference to FIGS. 2 and 3.

A drain of an NMOS transistor 8 is connected to a bit line 10, a gate of the transistor 8 is connected to a word line 14 and a source of the transistor 8 is grounded through a capacitor 9a as a memory capacitance of memory cell 52a. A plurality of memory cells each have the transitor 8. A bit line 11 is connected also to a plurality of memory cells 52b. A construction of a memory cell 52b is the same as the above mentioned memory cell 52a. The bit line 10 has a parasitic capacitance which is represented as a capacitor 23a and the bit line 11 has a parasitic capacitance represented as a capacitor 23b. The bit line 10 is connected to a drain of an NMOS transistor 18, a gate of an NMOS transistor 19, a drain of P-channel MOS transistor (hereinafter referred to as a PMOS) 20 and a gate of a PMOS transistor 21 respectively. The bit line 11 is connected to a gate of the transistor 18, a drain of the transistor 19, a gate of the transistor 20 and a drain of the transistor 21 respectively. A sense amplifier 1 includes NMOS transistors 18, 19 and a sense amplifier 2 includes PMOS transistors 20, 21.

The source of each of the transistor 18, 19, which are included in a sense amplifier 1, are connected to each other. A drain of a NMOS transistor 4 is connected to a portion to which each source of the transistors 18, 19 is connected. The source of the transistor 4 is grounded. A gate of the transistor 4 is connected to an input terminal 12, and a control signal, which controls power supply to the sense amplifier 1, is supplied to the input terminal 12 through the gate of the transistor 4. The drain of the transistor 4 is connected through a capacitor 3a to a power source, and is grounded through a capacitor 3b. The capacitors 3a, 3b are included in a capacitor section 3.

The sources of each of the transistors 20, 21, which include a sense amplifier 2, are connected to each other. A drain of a PMOS transistor 6 is connected to a portion to which the source of each of the transistors 20, 21 are connected. The source of the transistor 6 is connected to a positive side of a power source. The gate of the transistor 6 is connected to an input terminal 13, and a control signal, which controls power supply to the sense amplifier 2, is supplied to the input terminal 13. The drain of the transistor 6 is connected through a capacitor 5a to the power source, and is grounded through a capacitor 5b. The capacitors 5a, 5b are included in a capacitor section 5.

Further, the bit lines 10, 11 are connected to each other via a source and a drain of an NMOS transistor 7. A gate of the transistor 7 is connected to an input terminal 22, and a control signal, which turns the transistor 7 ON and OFF, is supplied to the input terminal 22. When an high level signal is supplied to the input terminal 22, the transistor 7 short circuits the bit lined 10, 11 to each other.

The sense amplifiers 1, 2, the capacitor sections 3, 5, and the transistors 4, 6, 7 form a sense amplifier section 24.

The operation of the embodiment according to the present invention will now be described with reference to FIG. 3.

During the period between time T1 and T3, a low (L) level signal is supplied to the input terminal 12 and a high (H) level signal to the input terminal 13. During the period between time T1 and T2, a H level signal is supplied to the input terminal 22. As a result, the transistors 4, 6 are turned OFF, and the transistor 7 is turned ON. The bit lines 10, 11 are short-circuited and precharged.

Before the above-mentioned pre-charge is performed, the bit lines 10, 11 are maintained under the condition that data is read from the memory cells 52a, 52b. Either bit line 10 or 11 is at a H level; or either bit line 10 or 11 is at a L level.

Once the bit lines 10, 11 are short-circuited, during the period between time T1 and T2, the bit line 10 develops an electrical potential determined by a balance parasitic capacitor 23a, and the bit line 11 develops an electric potential determined by a balanced parasitic capacitor 23b.

Once the bit lines 10, 11 are short-circuited, the electric potentials of the bit lines 10, 11 are changed. This causes a change to ON and OFF of the transistors 18, 19, which compose the sense amplifier 1, and of the transistors 20, 21, which compose the sense amplifier 2. The charges of the capacitor sections 3, 5 through the transistors 18 to 21 are thus balanced against the parasitic capacitors 23a, 23b of the bit lines 10, 11.

At this time, if the value of a threshold voltage of the transistors 18, 19 is Vtn, and the value of a threshold voltage of the transistors 20, 21 is Vtp, ordinarily, since Vtn is positive and Vtp is negative, when each voltage applied between the gate and the source of each of the transistors 18, 19 is not more than the above-described threshold voltages Vtn and when each voltage applied between the gate and the source of each of the transistors 20, 21 is not less than the above-described threshold voltages Vtp, the transistors are turned OFF. That is, at that point a potential difference between an electric potential of the output of the capacitor section 3 or a power source 16 of the sense amplifier 1 and that of the bit lines 10, 11 becomes Vtn, and at that point a potential difference between an electric potential of the output of the capacitor section 5 or a power source 17 of the sense amplifier 2 and that of the bit lines 10, 11 becomes -Vtp, each of the transistors is turned OFF and returns to a normal state. As shown in FIG. 3, during the period between time T1 and T2, the electric potential of the power source 16 of the sense amplifier 1 is lower than those of the bit lines 10, 11 by the value Vtn of the threshold voltage. Further, during the period between time T1 and T2, the electric potential of the power source 17 of the sense amplifier 2 is higher than those of the bit lines 10, 11 by the value Vtp of the threshold voltage.

At time T2 a L level signal is supplied to the input terminal 22 to turn the transistor 7 OFF. With a word line 14 kept at a L level, a word line 15 is changed from a L level to a H level. This causes a transistor 8 in a memory cell 52a to turn ON. Should the capacity of a capacitor 9b in a memory cell 52b be at an initial state of the L level, the parasitic capacitor 23b of the bit line 11 is balanced against the capacity of the capacitor 9b in the memory cell 52b, thereby the electric potential of the bit line 11 drops. When the electric potential of the bit line 11 drops, the transistor 20 is turned ON and the transistor 18 OFF. When the transistor 20 is turned ON, the parasite capacitor 23a of the bit line 10 is balanced against the capacity of the capacitor section 5. Thus, the electric potential of the bit line 10 rises. As has been described before, the electric potential of the bit line 10 rises to a higher electric potential, since the electric potential of the output of the capacitor section 5 is higher than those of the bit lines 10, 11 by the value Vtp of the threshold voltage.

When the electric potential of the bit line 10 rises, the transistor 19 is turned ON. The parasitic capacitor 23b of the bit line 11 is balanced against the capacitance of the capacitor section 3.

Thus, the electric potential of the bit line 11 drops. As has been described before, the electric potential of the bit line 11 drops to a lower electric potential, since the electric potential of the output of the capacitor section 3 is lower than those of the bit line 10, 11 by the value Vtn of the threshold voltage.

A postitive feedback loop is thus established. The bit line 10 is set to an electric potential, which is determined by the ratio between the parasitic capacitor 23a and the capacitance of the capacitor section 5. The bit line 11 is set to an electric potential, which is determined by the ratio between the parasitic capacitor 23a and the capacitance of the capacitor section 3. In this embodiment, if the capacitance of the capacitor sections 3, 5 are larger than the parasitic capacitor 23a, 23b, the electric potential of the bit line 10, 11 theoretically comes to Vtn+Vtp. The value, Vtn+|Vtp|, is approximately 2 volts.

After the above-described pre-sense conditions have been established, at time T3, if a signal to the input terminal 12 is changed from a L level to a H level and also if a signal to the input terminal 13 is changed from a H level to a L level, the bit line 10 comes to a power source level and the bit line 11 comes to a ground level.

In this embodiment, the initial state of the capacitor 9 in relation to the memory cell 52b is set at a L level. If the initial state of the capacitor 9 is set at a H level, the transistor 18 is turned ON and then the transistor 21 is turned ON by the equilibrium between the parasitic capacitor 23b of the bit line 11 and the capacitor 9b. As a result, a positive feedback loop is established, and thus an electric potential, which is the reverse of the aforementioned electric potential is provided. Furthermore, the same operation as described above will be performed, if the word line 15 is set at a L level and the word line 14 is changed from a L level to a H level.

An effect of the semiconductor memory device in this embodiment according to the present invention will now be described.

Figure 4:
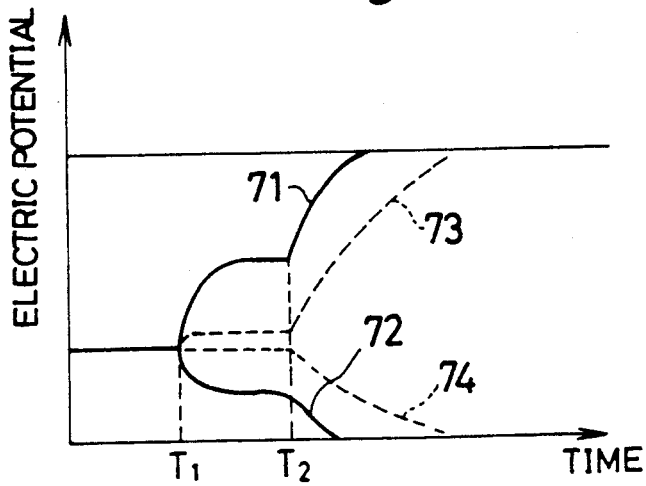
FIG. 4 is a diagram showing an operation of the sense amplifier device of FIG. 2.

In FIG. 4, a solid line 71 indicates the electrical potential of the bit line 10, a solid line 72 the electrical potential of the bit line 11 according to this embodiment, and broken lines 73, 74 indicate electric potential of the bit line 10, 11 according to a conventional semiconductor memory device.

The invention has been described in detail with particular reference to the embodiment, but it should be understood that variations and modifications of the invention can be made within the spirit and scope of the invention.

What is claimed is:

1. A semiconductor memory device comprising:
   a pair of bit lines each having a parasitic capacitor and a memory cell connected thereto respectively, said memory cell having an electric capacitance; and
   a sense amplifier device having a first sense amplifier, a second sense amplifier, a first transistor, a second transistor and a third transistor for amplifying a potential difference between said pair of bit lines said potential difference being caused by a balance between the parasitic capacitor of one bit line and the electric capacitance of one memory cell connected to said one bit line after said pair of bit lines are short-circuited for a predeteremined time;
   said first sense amplifier being connected to each of said pair of bit lines at an output thereof and to said first electric power source with a first capacitor at an input thereof;
   said second sense amplifier being connected to each of said pair of bit lines at an output thereof and to a second electric power source with a second capacitor at an input thereof;
   said third transistor being connected to said pair of bit lines to short-circuit the bit lines for said predetermined time;
   said first transistor being connected to said first electric power source at one end thereof and grounded at another end thereof for supplying an electric power to said first sense amplifier from said first electric power source during a time a first potential at said input of said first sense amplifier to said one bit line is greater than a first threshold voltage defined by said first sense amplifier;
   said second transistor being connected to a negative electric source of said second electric power source at one end thereof and to a positive electric source of said second electric power source at another end thereof for supplying another electric power to said second sense amplifier from said second electric power source during a time a second potential at said input of said second sense amplifier to said one bit line is less than a second threshold voltage defined by said second sense amplifier.

2. A semiconductor memory device according to claim 1, in which said first sense amplifier comprises a pair of NMOS transistors and said first transistor comprises an NMOS transistor.

3. A semiconductor memory device according to claim 2, in which one NMOS transistor of said first sense amplifier is connected to one bit line at a gate thereof, to said first electric power source at a source thereof and to another bit line at a drain, and another NMOS transistor of said first sense amplifier is connected to one bit line at a drain thereof, to said first electric power source at a source thereof and to another bit line at a gate.

4. A semiconductor memory device according to claim 1, in which said second sense amplifier comprises a pair of PMOS transistors and said second transistor comprises a PMOS transistor.

5. A semiconductor memory device according to claim 4, in which one PMOS transistor of said second sense amplifier is connected to one bit line at a gate thereof, to said second electric power source at a source thereof and to another bit line at a drain, and another NMOS transistor of said second sense amplifier is connected to one bit line at a drain thereof, to said second electric power source at a source thereof and to another bit line at a gate.

6. A semiconductor memory device according to claim 2, in which said second sense amplifier comprises a pair of PMOS transistors and said second transistor comprises a PMOS transistor.

7. A semiconductor memory device according to claim 3, in which said second sense amplifier comprises a pair of PMOS transistors and said second transistor comprises a PMOS transistor.

8. A semiconductor memory device comprising:
   a pair of bit lines each having a respective parasitic capacitor and having a respective memory cell connected to the bit line, said memory cell having an electric capacitance;
   a first sense amplifier and a second sense amplifier for amplifying potential differences between said pair of bit lines related to balancing the parasitic capacitor of a bit line and the electric capacitance of the memory cell connected to said bit line after said bit lines are short-circuited;

a first electrical power source having a first capacitor, wherein said first sense amplifier is connected to each of said bit lines at an output thereof and to said first electric power source at an input thereof;

a second electrical power source having a second capacitor, wherein said second sense amplifier is connected to each of said bit lines at an output thereof and to said second electric power source at an input thereof;

a first transistor connected to said first electric power source to one end thereof and grounded at another end thereof for supplying electric power to said first sense amplifier from said first electric power source when the potential at said input of said first sense amplifier relative to the potential of a selected bit line has a first selected relationship to a first threshold voltage defined by said first sense amplifier;

a second transistor connected to said second electric power source at one end thereof and to a source having a selected electrical polarity at another end thereof for supplying electric power to said second sense amplifier from said second electric power source when a second potential at said input of said second sense amplifier relative to the potential of a selected bit line has a second selected relationship to a second threshold voltage defined by said second sense amplifier; and a third transistor connected to said bit lines for selectively short-circuiting said bit lines.

* * * * *